United States Patent [19]
Fujita et al.

[11] Patent Number: 4,925,829
[45] Date of Patent: May 15, 1990

[54] METHOD FOR PREPARING THIN FILM OF COMPOUND OXIDE SUPERCONDUCTOR BY ION BEAM TECHNIQUES

[75] Inventors: Nobuhiko Fujita; Hideo Itozaki; Saburo Tanaka; Shuji Yazu; Tetsuji Jodai, all of Itami, Japan

[73] Assignee: Sumitomo Electric Industries, Ltd., Osaka, Japan

[21] Appl. No.: 198,260

[22] Filed: May 25, 1988

[30] Foreign Application Priority Data

May 26, 1987 [JP] Japan ................... 128773

[51] Int. Cl.$^5$ ............... B05D 5/12; B05D 3/06; C23C 16/00
[52] U.S. Cl. ............................. 505/1; 427/38; 427/62; 427/42; 427/255.3; 427/126.3; 505/732; 505/731
[58] Field of Search .......... 427/38, 62, 63, 255.3, 427/42, 126.3; 505/1, 731, 732, 730

[56] References Cited

U.S. PATENT DOCUMENTS

| | | | |
|---|---|---|---|
| 4,634,600 | 1/1987 | Shimizu et al. | 427/38 |
| 4,861,750 | 8/1989 | Nogawa et al. | 505/1 |

FOREIGN PATENT DOCUMENTS

| | | |
|---|---|---|
| 0285132 | 10/1988 | European Pat. Off. |
| 0288001 | 10/1988 | European Pat. Off. |
| 0292387 | 11/1988 | European Pat. Off. |
| 2602246 | 2/1988 | France |
| 55-65358 | 5/1980 | Japan |

OTHER PUBLICATIONS

Japanese Journal of Applied Physics, vol. 26, No. 4 Apr. 1987 pp. L508–L509, N. Terada et al., for "Deposition of $Sr_xLa_{2-x}CuO_{4-y}$ Thin Films by Sputtering".

Japanese Journal of Applied Physics, vol. 26, No. 4, Apr. 1987 pp. L388–L390, M. Kawaski et al., for "Composition and Structural Analalysis for Optimizing the Preparation Conditions of Super conducting $(La'_{1-x}Sr_x)_yCuO_{4-delta}$ Films by Sputtering".

Koch et al., "Thin Films and Squids Made From $YBa_2Cu_3O_y$," MRS ed. Gubser et al., Apr. 1987, (Anaheim, CA) pp. 81–84.

Wu et al., "Superconducting at 93 K in a New Mixed-Phase Y—Ba—Cu—O Compound System at Ambient Pressure" Phys. Rev. Lett. 58(9) Mar. 1987 p. 908.

"New Class of Superconductors Pushing Temperatures Higher" C&EN May 16, 1988, pp. 24–29.

Primary Examiner—Norman Morgenstern
Assistant Examiner—Roy V. King
Attorney, Agent, or Firm—Pennie & Edmonds

[57] ABSTRACT

A method for preparing a thin film of a composite copper oxide superconductor with a deposition source of the compound copper oxide, by applying an oxygen ion beam from an ion source onto a substrate while changing beam intensity during formation of the superconducting thin film, thereby to physically deposit evaporative particles from the deposition source on the substrate.

19 Claims, 1 Drawing Sheet

METHOD FOR PREPARING THIN FILM OF COMPOUND OXIDE SUPERCONDUCTOR BY ION BEAM TECHNIQUES

BACKGROUND OF THE INVENTION

1. Field of the Invention

The present invention relates to a method for preparing a compound oxide superconductor thin film, and more particularly, it relates to a method for preparing a compound oxide superconducting thin film of homogeneous composition having a high critical temperature of superconduction.

2. Description of the Prior Art

Superconduction, which is explained as phase transition of electrons, is a phenomenon by which a conductor loses all resistance to electric current under specific conditions to present complete diamagnetism.

Various types of superconducting devices have been proposed and developed in the field of electronics, to which the superconducting phenomenon is typically applied. A typical example of such superconducting devices is that employing the Josephson effect, through which a quantum effect is macroscopically developed by applied current when superconductive materials are weakly joined with each other. A tunnel junction type Josephson device, which has a small energy gap between superconductive materials, is expected as a switching device of an extremely high speed with low power consumption. Further, application of the Josephson device to a supersensitive sensor for magnetic fields, microwaves, radioactive rays or the like is also expected since the Josephson effect for electromagnetic waves or magnetic fields is developed as a correct quantum phenomenon.

Development of a superconducting device for a very high speed computer is demanded since power consumption per unit area has approached the limit of cooling ability, while application of a superconductive material having no current loss to an interconnection member is demanded with improvement in degree of integration of an electronic circuit.

In spite of various efforts, superconduction critical temperatures $T_C$ of conventional superconductive materials remained below 23 K, that of $Nb_3Ge$, for many years. However, it was discovered in 1986 that sintered bodies of $[La,Ba]_2CuO_4$, $[La,Sr]_2CuO_4$ and the like superconduct at higher critical temperatures, to open the possibility of non-cryogenic superconduction. It has been observed that these substances superconduct at critical temperatures of 30 to 50 K, which are extremely higher than those of the conventional materials. Some of the substances have superconducted at temperatures exceeding 70 K.

It has been announced that a compound oxide called YBCO, which is expressed as $Y_1Ba_2Cu_3O_{7-x}$, is a 90 K level superconductor. Further, compound oxides of Bi—Sr—Ca—Cu and Tl—Ba—Ca—Cu, which superconduct at temperatures exceeding 100 K, are so chemically stable that the same are not deteriorated in superconductivity with time, dissimilarly to YBCO or the like.

Superconductivity of a superconductor prepared by any such compound oxide is greatly influenced by oxygen deficiency in crystal. If oxygen deficiency in crystal is improper, the critical temperature is reduced and the difference between an onset temperature and a temperature at which electrical resistance completely disappears increases.

In general, a superconductor thin film of the aforementioned compound oxide has been provided by forming a film by physical deposition such as sputtering with a deposition source of an oxide generated by sintering or the like and thereafter performing heat treatment in an oxygen atmosphere or exposing the film to oxygen plasma.

Such a compound oxide superconductor material is easily deteriorated in superconductivity particularly when the same is provided in the form of a thin film. This is conceivably because oxygen deficiency in crystal of the compound oxide superconductor is improper during in formation of the thin film, to cause a significant problem in use of the compound oxide superconductor material.

SUMMARY OF THE INVENTION

An object of the present invention is to solve the aforementioned problem of the prior art and provide a method for preparing a thin film of a compound oxide superconductive material having a high critical temperature $T_C$, which is homogeneous in composition and structure.

The present invention provides a method for preparing a thin film of superconductor composed of compound oxide on a substrate by physical vapor deposition technique, characterized in that the substrate on which evaporated particles are deposited is irradiated by oxygen ion beam whose intensity is varied in time while the evaporated particles deposit on the substrate.

The superconducting thin film produced by the method according to the present invention may be a compound oxide superconductor having pseudo-perovskite crystal structure of composition expressed in, for example, a general formula $(\alpha_{1-x}\beta_x)\gamma_y O_z$, in which $\alpha$ stands for an element selected from group IIa of the periodic table, $\beta$ stands for an element selected from group IIIa of the periodic table, and an element $\gamma$ stands for selected from groups Ib, IIb, IIIb, IVa and VIIIa of the periodic table, x is an atomic ratio of $\beta$ with respect to $(\alpha+\beta)$ and satisfies a range of $0.1 \leq x \leq 0.9$, and y and z are respective atomic ratios with respect to $(\alpha_{1-x}\beta_x)$ which is considered to be equal to 1 and each satisfy ranges of $0.4 \leq y$ 3.0 and $1 \leq z \leq 5$ respectively, such as $(Sr,La)_2CuO_4$ and $(Ba,La)_2CuO_4$.

The element $\alpha$ belonging to group IIa of the periodic table is preferably selected from Ba, Sr, Ca, Mg and Be, more preferably from Ba and Sr, for example. 10 to 80% of this element $\alpha$ may be displaced by one or two elements selected from Mg, Ca and Sr. The element $\beta$ belonging to group IIIa of the periodic table is preferably selected from Y and the lanthanides such as La, Nd, Sm, Eu, Gd, Dy, Ho, Er, Tm or Yb, and more preferably from Y, La and Ho, for example. 10 to 80% of a lanthanide element may be displayed by one or two elements selected from the other lanthanoids. The element $\gamma$ is generally Cu, which may be partially displaced by another element selected from those belonging to groups Ib, IIb, IIIb, IVa and VIIIa of the periodic table, such as Ti or V. In more concrete terms, the inventive superconductor is preferably prepared by a compound oxide expressed in any of the following formulas:

$Y_1Ba_2Cu_3O_{7-x}$, $La_1Ba_2Cu_3O_{7-x}$,
$Ho_1Ba_2Cu_3O_{7-x}$, $Nd_1Ba_2Cu_3O_{7-x}$, $Sm_1Ba_2Cu_3O_{7-x}$, $Eu_1Ba_2Cu_3O_{7-x}$, $Gd_1Ba_2Cu_3O_{7-x}$, $Dy_1Ba_2Cu_3O_{7-x}$, $Er_1Ba_2Cu_3O_{7-x}$, $Yb_1Ba_2Cu_3O_{7-x}$ where x represents a number satisfying $0<x<1$.

The thin film which can be produced by the present invention, preferably includes a superconductor thin film which is conceivably in a mixed phase mainly formed of a compound oxide being in composition expressed as $\Theta_4(\Phi_{1-q},Ca_q)_mCu_nO_{p+r}$ in which $\Theta$ stands for Bi or Tl, $\Phi$ stands for Sr when $\Theta$ is Bi and stands for Ba when $\Theta$ is Tl, m and n are numbers each satisfying ranges of $6 \leq m \leq 10$ and $4 \leq n \leq 8$ respectively, $p=(6+m+n)$, q is a number which satisfies a range of $0 < q \leq 1$, and r is a number which satisfies a range of $-2 \leq r \leq 2$, such as $Bi_4Sr_4Ca_4Cu_6O_{20+r}$, where r represents a number satisfying $-2 \leq r \leq +2$, $Bi_2Sr_2Ca_2Cu_3O_{10+r}$, where r represents a number satisfying $-2 \leq r \leq +2$, $Tl_4Ba_4Ca_4Cu_6O_{20+r}$, where r represents a number satisfying $-2 \leq r \leq +2$, or $Tl_2Ba_2Ca_2Cu_3O_{10+r}$, where r represents a number satisfying $-2 \leq r \leq +2$, while the superconductor may be in a single phase expressed in any of the above formulas.

According to a preferred embodiment of the present invention, the deposition source is preferably prepared by mixed powder of oxides or carbonates of constituents for the compound oxide superconductor temporarily sintered at a temperature of 250° to 1200° C. or regularly sintered at a temperature within a range of 700° to 1500° C. The deposition source may be provided in the form of sintered powder or a sintered block. The term "temporary sintering" herein used indicates treatment of temporarily firing a powder material to obtain a compound oxide.

According to another embodiment of the present invention, a plurality of deposition sources may be employed to perform physical deposition. When Ba is selected as $\alpha$, Y is selected as $\beta$ and Cu is selected as $\gamma$, for example, three deposition sources may be prepared by oxides of Ba, Y and Cu respectively. Alternatively, the method according to the present invention may be carried out by employing two deposition sources of $Ba_{1-x}Y_xO_z$, where x and z represent the numbers defined above, and an oxide of Cu.

The deposition source employed in the present invention is preferably in atomic ratios Y/(Y+Ba) of 0.06 to 0.94, more preferably of 0.1 to 0.4, Ba/(La+Ba) of 0.04 to 0.96, more preferably of 0.08 to 0.45 and Sr/(La+Sr) of 0.03 to 0.95, more preferably of 0.05 to 0.1. The atomic ratios of constituents for the compound oxide superconductor in the aforementioned deposition source are determined in accordance with those of constituents for the compound oxide superconductor forming a target thin film. For example, the atomic ratios between Ba, Y and Cu in the deposition source are adjusted on the basis of those between Ba, Y and Cu in the thin film to be formed, in response to deposition efficiency value, reaction factors etc. of Ba, Y and Cu.

According to the present invention, an O or $O_2$ ion beam is applied to a substrate in deposition. The ion source is preferably of a differentially exhaustible cold cathode type. $O_2$ gas being within a range of $1.7 \times 10^{-5}$ to $8.3 \times 10^{-3}$ Torr. preferably flows in the ion source, discharge voltage of which is preferably in a range of 0.5 to 10 kV. Acceleration voltage of the ion source is preferably within a range of 50 V to 40 kV.

According to still another embodiment of the present invention, the deposition atmosphere preferably contains $O_2$ with $O_2$ partial pressure being within a range of $1.0 \times 10^{-8}$ to $1.0 \times 10^{-2}$ Torr.

According to a further embodiment of the present invention, the substrate is heated by a heater to a temperature within a range of 230° to 1410° C. The substrate is preferably prepared of an MgO monocrystal or $SrTiO_3$ monocrystal, or may be glass, quartz, Si, stainless steel or a ceramic material.

The present invention is characterized in that physical deposition is performed by applying an O or $O_2$ ion beam while changing beam intensity through a deposition source of a compound oxide, thereby to form a thin film of a compound oxide superconductor.

The thin film formed according to the method of the present invention is conceivably in a mixed phase of composition expressed in a general formula $(\alpha_{1-x}\beta_x)\gamma_xO_z$, where $\alpha$, $\beta$ and $\gamma$ represent the elements defined above, x represents the atomic ratio of $\beta$ to $\alpha+\beta$ such that $0.1 \leq x \leq 0.9$, and y and z represent atomic ratios satisfying $0.4 \leq y \leq 3.0$ and $1 \leq z \leq 5$ respectively when $(\alpha_{1-x}\beta_x)=1$; $Y_1Ba_2Cu_3O_{7-x}$, for example.

An oxide employed as the deposition source in the present invention is a sintered member provided by sintering powder materials of oxides or carbonates of Ba, Y and Cu, when Ba is selected as $\alpha$, Y is selected as $\beta$ and Cu is selected as $\gamma$, for example, as hereinabove described. The deposition source may be temporarily or regularly sintered. Further, the deposition source may be in the form of powder obtained by pulverizing a sintered body, or a sintered block. In the case of the sintered powder, the particle size is preferably within a range of 0.01 to 1 mm. When such a powdered deposition source is employed, the film-forming rate is advantageously increased.

According to a further embodiment of the present invention, the deposition source is preferably in atomic ratios Y/(Y+Ba) of 0.06 to 0.94, more preferably of 0.1 to 0.4, Ba/(La+Ba) of 0.04 to 0.96, more preferably of 0.03 to 0.45 and Sr/(La+Sr) of 0.03 to 0.95, more preferably of 0.05 to 0.1. If the atomic ratios of the deposition source are out of the above ranges, a desired critical temperature of superconduction cannot be obtained since the crystal structure of the deposited film is not the a desired pseudo-perovskite structure.

When Ba is selected as $\alpha$, Y is selected as $\beta$ and Cu is selected as $\gamma$, for example, the atomic ratios between Ba, Y and Cu in the deposition source are preferably determined on the basis of those between Ba, Y and Cu in the thin film in consideration of deposition efficiency, reaction factors and the like of Ba, Y and Cu. This is because the oxides of Ba, Y and Cu, being constituents for the inventive thin film, are different in melting point, vapor pressure etc. from each other, and are thus dissimilar in deposition efficiency, reaction factor etc. Namely, the thin film cannot be in desired atomic ratios unless constituents of the deposition source are properly selected. In case of sputtering, atomic ratios in the deposition source can be determined through calculation from sputtering coefficients of respective metal oxides and vapor pressure etc. on the substrate.

According to the present invention, and O or $O_2$ ion beam is applied to the substrate during film deposition while changing beam intensity. Superconductivity of an oxide superconductor is greatly influenced by oxygen deficiency in the crystal. However, there has been established no technique of controlling oxygen deficiency, and hence the superconductivity of an oxide superconductor is instable. In order to solve such a problem, the present invention supplies an oxygen concentration gradient to a deposited film by applying an oxygen ion beam during film formation while changing beam intensity. Through such oxygen ion beam application, a part of the deposited film is necessarily provided with proper oxygen concentration, to be excellent in superconductivity. A superconductor being at least partially excellent in superconductivity is regarded as highly superconductive as a whole.

Only the $O_2$ ion beam is preferably employed in the present invention, and hence the ion source is preferably a cold cathode source. Further, $O_2$ gas within a range of $1.7 \times 10^{-5}$ to $8.3 \times 10^{-3}$ Torr. preferably flows in the ion source. The $O_2$ ion beam is deficient when the flow rate of the $O_2$ gas is below $1.7 \times 10^{-5}$ Torr. while the same is excessive when the flow rate is above $8.3 \times 10^{-3}$ Torr., whereby the target thin film may not be properly formed. The ion source is preferably differentially exhaustible, since this ion source is different in pressure from a chamber.

Discharge voltage of the ion source is preferably within a range of 0.5 to 10 kV. If the discharge voltage is less than 0.5 kV, insufficient ions are generated while the excited state of the ions is unstable when the discharge voltage exceeds 10 kV. Further, the acceleration voltage of the ions is preferably within a range of 50 V to 40 kV. If the acceleration voltage is less than 50 V, sufficient oxygen cannot be introduced into the thin film, while the cost of the apparatus is increased when the acceleration voltage exceeds 40 kV.

According to the present invention the physical vapor deposition is preferably performed through evaporation in low-pressure gas in a deposition atmosphere containing $O_2$ with $O_2$ partial pressure in a range of $1.0 \times 10^{-8}$ to 1.0 to $10^{-2}$ Torr. When the $O_2$ partial pressure is less than $1.0 \times 10^{-8}$ Torr., the deposition film is inferior in crystallinity and it is difficult to obtain a perovskite or pseudo-perovskite oxide. Crystallinity is improved as the $O_2$ partial pressure is increased, while the deposition rate is extremely reduced when the $O_2$ partial pressure exceeds $1.0 \times 10^{-2}$ Torr.

According to a further embodiment of the present invention, the substrate is preferably a MgO monocrystal, or $SrTiO_3$ monocrystal with its (001) or (110) plane being employed as the film forming surface. This is because the compound oxide superconductor employed in the inventive method has crystal anisotropy in its superconduction critical current density, and it is possible to make current easily flow in the horizontal or depth direction of the thin film by employing the film forming surface of the aforementioned substrate.

According to a further embodiment of the present invention, the substrate is heated by a heater to 230° to 1410° C. Such heating of the substrate acts on the thin film similarly to sintering, thereby to provide a proper perovskite or pseudo-perovskite oxide. However, it is difficult to control composition of the deposition film if the substrate temperature is too high, whereby the desired perovskite or pseudo-perovskite oxide cannot be obtained.

According to the present invention as hereinabove described, it is possible to provide a thin film of a superconducting oxide which is higher in stability of superconductivity and critical temperature than the conventional superconductor. Thus, the present invention is effectively applied to the field of employing a superconductor as a thin film device such as a Matisoo switching device called a Josephson device, an Anacker memory device or a superconducting quantum interferometer (SQUID).

These and other objects, features, aspects and advantages of the present invention will become more apparent from the following detailed description of the present invention when taken in conjunction with the accompanying drawing.

DESCRIPTION OF THE PREFERRED EMBODIMENT

Figure 1:
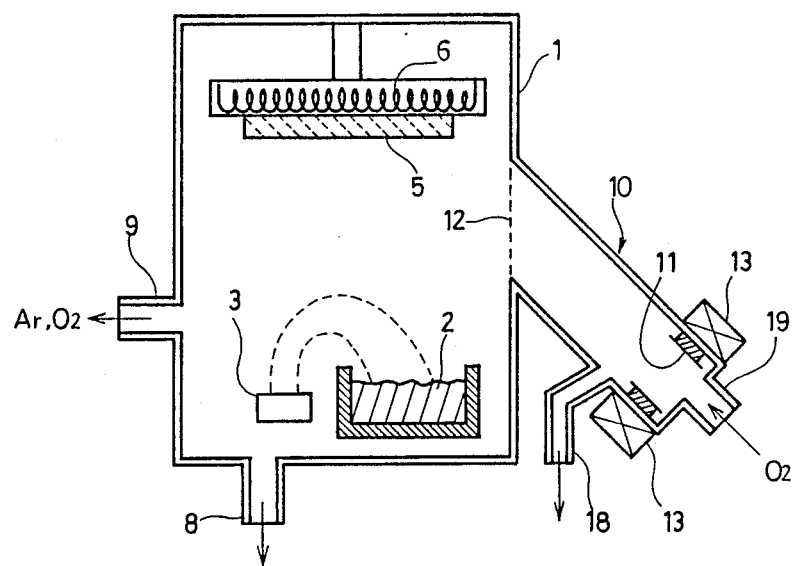
FIG. 1 schematically illustrates a deposition apparatus employed for providing a superconducting thin film in an embodiment of the present invention.

FIG. 1 schematically illustrates a deposition apparatus, which is employed for providing a superconducting oxide thin film in an embodiment of the present invention.

The apparatus as shown in FIG. 1 mainly comprises a chamber 1, a deposition source 2 and an electron gun 3 for induction-heating the deposition source 2, both of which are arranged in the chamber 1, and a substrate 5 opposed to the deposition source 2 to be provided with a thin film on its surface. The chamber 1 is connected with a vacuum pump (not shown) through an exhaust hole 8, so that its interior can be evacuated.

A differentially exhaustible ion source 10 is mounted on the chamber 1 toward the substrate 5. This ion source 10 is formed by an introduction hole 19 for introducing $O_2$ gas, an exhaust hole 18, a cold cathode type ion generating electrode 11 and an ion extracting electrode 12.

A heater 6 is mounted on the substrate 5 to adjust its temperature. Further, an introduction hole 9 for atmospheric gas is mounted on the chamber 1.

Description is now made of the procedure for carrying out the method according to the present invention by utilizing the apparatus as shown in FIG. 1.

The deposition source 2 and the substrate 5 are mounted in the chamber 1, which is then evacuated to introduce $O_2$ gas to a prescribed pressure level. $O_2$ gas is also introduced into the ion source 10 to a prescribed level. The substrate 5 is heated by the heater 6 to an appropriate temperature, and the electron gun 3 is started to apply high-frequency power to the target 2, thereby to start deposition. The amounts of supply and exhaust are so adjusted that $O_2$ gas partial pressure in the chamber 1 is not changed during deposition. The $O_2$ ion beam is adjusted by control of the voltage applied to the ion generating electrode 11 and to the ion extracting electrode 12.

Description is now made on Examples of the present invention, while the scope of the present invention is not limited by these Examples, as a matter of course.

In each Example, a compound oxide superconducting thin film was provided by utilizing the deposition apparatus as shown in FIG. 1.

For the purpose of comparison, two types of thin films were formed for each Example under the same conditions, with application and no application of the oxygen ion beam. Film-forming conditions of respective Examples are listed in Tables.

EXAMPLE 1

The substrate 5 and the deposition source 2 were mounted in the chamber 1, which was then evacuated to $2 \times 10^{-10}$ Torr. to introduce $O_2$ gas of $5.0 \times 10^{-6}$ Torr. The ion source 10 was also evacuated to $3 \times 10^{-8}$ Torr. to introduce $O_2$ gas of $5 \times 10^{-4}$ Torr. The substrate 5 was heated up to 600° C., to start deposition. The deposition source 2 was heated by the electron gun 3, and discharge voltage of 1.1 kV and acceleration voltage of 1.0 kV were first applied to the ion source 10. The deposition source 2 was a $YBa_2Cu_3O_7$ sintered block, which was obtained by mixing $Y_2O_3$ and $BaCO_3$ in the mole ratio Y/Ba of 1:2, mixing CuO by 10 wt. % in excess of an amount for attaining the mole ratio 1:2:3 between Y, Ba and Cu and sintering the mixed substance at 950° C. The substrate 5 was an MgO monocrystal substrate, the (001) plane of which was employed as a film forming surface.

A film was formed on the substrate 5 at a film forming rate of about 0.50 Å /sec. to be in thickness of 1 μm by continuously changing the discharge voltage and acceleration voltage of the ion source 2 from 0.8 to 1.3 kV and from 0.5 to 2 kV respectively while changing intensity of the oxygen ion beam. Then, a sample was prepared to measure resistance of the thin film thus obtained, by forming a pair of Al electrodes on both end portions of the thin film formed on the substrate 5 by vacuum deposition and soldering lead wires to the Al electrodes.

The sample was dipped in liquid helium in a cryostat and temporarily cooled to 8 K to confirm transistion to a superconducting state. Then the sample was gradually heated by a heater, thereby to measure a temperature $T_{Ci}$ at which the sample started to lose superconductivity and present electric resistance, and a temperature $T_C$ at which the sample completely lost superconductivity.

Table 1 shows principal film forming conditions and the temperatures $T_C$ and $T_{Ci}$ of Example 1.

EXAMPLE 2

The deposition source 2 was an $LaBa_2Cu_3O_7$ sintered block obtained by mixing $La_2O_3$ and $BaCO_3$ in the mole ratio La/Ba of 1:2, mixing CuO by 10 wt. % in excess of an amount for attaining the mole ratio 1:2:3 between La, Ba and Cu and sintering the mixture at 970° C. The substrate 5 was an MgO monocrystal substrate, the (001) plane of which was employed as a film forming surface.

A thin film was formed by a procedure identical to that of Example 1, to measure temperatures $T_C$ and $T_{Ci}$ in a similar manner. Table 1 also shows principal film forming conditions and the temperatures $T_C$ and $T_{Ci}$ of Example 2.

EXAMPLE 3

As a deposition source a sintered block of $(La_{0.925},Sr_{0.075})_2CuO_4$ was obtained by mixing $La_2O_3$ and $SrCO_3$ in the mole ratio La/Sr of 0.925/0.075, mixing CuO by 10 wt. % in excess of an amount for attaining an atomic ratio 1.85:0.15:1 between La, Sr and Cu and sintering the mixture at 925° C. The substrate 5 was an $SrTiO_3$ monocrystal substrate, the (001) plane of which was employed as a film forming surface.

A thin film was formed by a procedure identical to that of Example 1, to similarly measure temperatures $T_C$ and $T_{Ci}$. Table 1 also shows principal film forming conditions and the temperatures $T_C$ and $T_{Ci}$ of Example 3.

EXAMPLE 4

The deposition source 2 was a $Bi_4Sr_4Ca_4Cu_6O_{20+r}$ ($-2 \leq r \leq 2$) block obtained by mixing $Bi_2O_3$, $SrCO_3$, CaO and CuO powder to be in composition, after sintering, of $Bi_4Sr_4Ca_4Cu_6O_{20+r}$, and sintering the mixture at 820° C. The substrate 5 was an $SrTiO_3$ monocrystal substrate, the (110) plane of which was employed as a film forming surface.

A thin film was formed in procedure identical to that of Example 1, to similarly measure temperatures $T_C$ and $T_{Ci}$. Table 2 shows principal film forming conditions and the temperatures $T_C$ and $T_{Ci}$ of Example 4.

EXAMPLE 5

The deposition source 2 was a $Tl_4Ba_4Ca_4Cu_6O_{20+r}$ ($-2 \leq r \leq 2$) block obtained by mixing $Tl_2O_3$, $BaCO_3$, CaO and CuO powder to be in composition, after sintering, of $Tl_4Ba_4Ca_4Cu_6O_{20+r}$, and sintering the mixture at 910° C. The substrate 5 was an $SrTiO_3$ monocrystal substrate, the (110) plane of which was employed as a film forming surface.

A thin film was formed in procedure identical to that of Example 1, to similarly measure temperatures $T_C$ and $T_{Ci}$. Table 2 also shows principal film forming conditions and the temperatures $T_C$ and $T_{Ci}$ of Example 5.

TABLE 1

| Example | $O_2$ Partial Pressure (Torr) | Substrate Temperature (°C.) | Ion Source $O_2$ Pressure (Torr) | Ion Source Discharge Voltage (kV) | Ion Source Acceleration Voltage (kV) | Film Forming Rate (Å/sec.) | $T_C$ (K) | $T_{Ci}$ (K) |
|---|---|---|---|---|---|---|---|---|
| 1 | $5.0 \times 10^{-5}$ | 600 | $5 \times 10^{-4}$ | 0.8 ~ 1.3 | 0.5 ~ 2.0 | 0.5 | 98 | 72 |
|   |                      |     |                    | —         | —         | 0.5 | 66 | 13 |
| 2 | $2.0 \times 10^{-5}$ | 700 | $5 \times 10^{-4}$ | 0.8 ~ 1.3 | 0.7 ~ 1.5 | 1.0 | 77 | 59 |
|   |                      |     |                    | —         | —         | 1.0 | 21 | —  |
| 3 | $1.0 \times 10^{-5}$ | 750 | $5 \times 10^{-4}$ | 0.8 ~ 1.3 | 0.5 ~ 3.0 | 1.0 | 73 | 55 |
|   |                      |     |                    | —         | —         | 1.0 | 34 | —  |

TABLE 2

| Example | $O_2$ Partial Pressure (Torr) | Substrate Temperature (°C.) | Ion Source $O_2$ Pressure (Torr) | Ion Source Discharge Voltage (kV) | Ion Source Acceleration Voltage (kV) | Film Forming Rate (Å/sec.) | $T_C$ (K) | $T_{Ci}$ (K) |
|---|---|---|---|---|---|---|---|---|
| 4 | $8.0 \times 10^{-8}$ | 650 | $5 \times 10^{-4}$ | 0.8 ~ 1.3 | 0.6 ~ 2.5 | 1.5 | 90 | 95 |
|   |                      |     |                    | —         | —         | 1.5 | 88 | 64 |
| 5 | $1.0 \times 10^{-5}$ | 680 | $5 \times 10^{-4}$ | 1.0 ~ 3.0 | 1.0 ~ 3.0 | 2.0 | 85 | 70 |

TABLE 2-continued

| Example | O₂ Partial Pressure (Torr) | Substrate Temperature (°C.) | Ion Source O₂ Pressure (Torr) | Ion Source Discharge Voltage (kV) | Acceleration Voltage (kV) | Film Forming Rate (Å/sec.) | $T_C$ (K) | $T_{Ci}$ (K) |
|---|---|---|---|---|---|---|---|---|
| | — | — | — | — | — | 2.0 | 81 | 57 |

It has been proved by these Examples that crystal structure and oxygen concentration of a thin film can be properly controlled by application of the O₂ ion beam, to form an oxide superconducting thin film of improved properties.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. In a method for preparing a thin film of superconductor composed of a compound copper oxide on a substrate employing a physical vapor deposition technique, the improvement which comprises irradiating the substrate on which evaporated particles from a vapor source are deposited with an oxygen ion beam the intensity of which is varied in time while the evaporated particles are deposited on the substrate.

2. A method in accordance with claim 1, wherein said oxygen ion beam is composed of O and/or O₂ ions.

3. A method in accordance with claim 1, wherein said ion beam is produced by an ion source provided with a differentially exhaustible evacuation means.

4. A method in accordance with claim 1, wherein said ion beam is produced by a cold cathode type ion source.

5. A method in accordance with claim 1, comprising the further step of flowing oxygen gas through the source of oxygen ions at a pressure ranging from 1.7 to $10^{-5}$ to $8.3 \times 10^{-3}$ Torr.

6. A method in accordance with claim 1, wherein said ion beam is produced by an ion source which is actuated at a discharge voltage ranging from 0.5 kV to 10 kV.

7. A method in accordance with claim 1, wherein said ion beam is accelerated under a acceleration potential ranging from 50 V to 40 kV.

8. A method in accordance with claim 1, wherein said substrate is heated to a temperature ranging from 230° to 1,410° C. during the deposition of evaporated particles thereon.

9. A method in accordance with claim 1, wherein the physical vapor deposition is carried out in an atmosphere containing oxygen gas having a partial pressure ranging from $1.0 \times 10^{-8}$ to $1.0 \times 10^{-2}$ Torr.

10. A method in accordance with claim 1, wherein said substrate is a monocrystal of MgO or SrTiO₃.

11. A method in accordance with claim 10, wherein the evaporated particles are deposited on a (001) plane of said monocrystal.

12. A method in accordance with claim 10, wherein the evaporated particles are deposited on a (110) plane of said monocrystal.

13. A method in accordance with claim 1, wherein said thin film obtained is composed of a compound copper oxide having a composition represented by the general formula:

$$(\alpha_{1-x}\beta_x)[\gamma]Cu_yO_z$$

in which α stands for an element selected from group IIa of the periodic table, β stands for an element selected from group IIIa of the periodic table, x is the atomic ratio of β with respect to (α+β) and is $0.1 \leq x \leq 0.9$ and y and z satisfy $0.4 \leq y \leq 3.0$ and $1 \leq z \leq 5$ respectively.

14. A method in accordance with claim 1, wherein said thin film obtained is composed of a compound oxide having a composition represented by the general formula:

$$LnBa_2Cu_3O_{7-x}$$

in which Ln is at least one element selected from a group comprising Y, La, Nd, Sm, Eu, Gd, Dy, Ho, Er, Tm and Yb, and $0 \leq x < 1$.

15. A method in accordance with claim 1, wherein said thin film is a compound oxide represented by the general formula:

$$(La_{1-x}M_x)_2CuO_4$$

in which M stands for Ba or La, and $0 < x < 1$.

16. A method in accordance with claim 1, wherein said thin film is a compound oxide represented by the general formula:

$$\theta_4(\Phi_{1-q}Ca_q)_mCu_nO_{p+r}$$

in which θ stands for Bi or Tl, φ stands for Sr when θ is Bi and stands for Ba when θ is Tl, $6 \leq m \leq 10$ and $4 \leq n \leq 8$, $p = (6+m+n)$, $0 < q < 1$, and $-2 \leq r \leq +2$.

17. A method in accordance with claim 16, wherein said thin film obtained is a compound oxide having a composition:

$$Bi_4Sr_4Ca_4Cu_6O_{20+r}$$

$-2 \leq r \leq +2$.

18. A method in accordance with claim 16, wherein said thin film obtained is a compound oxide having a composition:

$$Tl_4Ba_4Ca_4Cu_6O_{20+r}$$

$-2 \leq r \leq +2$.

19. In a method for preparing a thin film of a compound copper oxide superconductor on a substrate by depositing particles evaporated from a vapor source composed of constituent elements of the compound copper oxide employing a physical vapor deposition technique, the improvement which comprises irradiating said substrate on which the evaporated particles are deposited with an oxygen ion beam the intensity of which is varied over time under an acceleration potential ranging from 50 V to 40 kV, while the evaporated particles are deposited on the substrate in an atmosphere containing oxygen gas having a partial pressure between $1.0 \times 10^{-8}$ and $1.0 \times 10^{-2}$ Torr, and in that said substrate is heated to a temperature between 230° and 1,410° C. during the deposition of the evaporated particles thereon.

* * * * *